(12) United States Patent
Lucero (10) Patent No.: US 11,842,973 B2
(45) Date of Patent: Dec. 12, 2023

(54) PILLARS AS STOPS FOR PRECISE CHIP-TO-CHIP SEPARATION

(71) Applicant: Google LLC, Mountain View, CA (US)

(72) Inventor: Erik Anthony Lucero, Goleta, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/106,170

(22) Filed: Feb. 6, 2023

(65) Prior Publication Data
US 2023/0187401 A1 Jun. 15, 2023

Related U.S. Application Data

(63) Continuation of application No. 16/614,108, filed as application No. PCT/US2017/052132 on Sep. 19, 2017, now Pat. No. 11,574,885.

(51) Int. Cl.
*H01L 23/00* (2006.01)
*G06N 10/00* (2022.01)
*H10N 60/12* (2023.01)

(52) U.S. Cl.
CPC ............ *H01L 24/16* (2013.01); *G06N 10/00* (2019.01); *H01L 24/13* (2013.01); *H01L 24/81* (2013.01); *H10N 60/12* (2023.02); *H01L 2224/13014* (2013.01); *H01L 2224/13109* (2013.01); *H01L 2224/1403* (2013.01); *H01L 2224/16145* (2013.01); *H01L 2224/81139* (2013.01);
(Continued)

(58) Field of Classification Search
CPC . H01L 2224/81136–81139; H01L 2224/81141
See application file for complete search history.

(56) References Cited

U.S. PATENT DOCUMENTS

| 2002/0079568 A1 | 6/2002 | Degani et al. |
| 2003/0032217 A1 | 2/2003 | Farnworth et al. |
| 2004/0121520 A1 | 6/2004 | Karkkainen |

(Continued)

FOREIGN PATENT DOCUMENTS

| CA | 2943489 A1 | 9/2015 |
| CN | 101436560 | 5/2009 |

(Continued)

OTHER PUBLICATIONS

AU Office Action in Australian Appln. No. 2017432809, dated Apr. 24, 2020, 5 pages.

(Continued)

*Primary Examiner* — Amar Movva
(74) *Attorney, Agent, or Firm* — Fish & Richardson P.C.

(57) ABSTRACT

A stacked device including a first substrate that includes a quantum information processing device, a second substrate bonded to the first substrate, and multiple bump bonds and at least one pillar between the first substrate and the second substrate. Each bump bond of the multiple bump bonds provides an electrical connection between the first substrate and the second substrate. At least one pillar defines a separation distance between a first surface of the first substrate and a first surface of the second substrate. A cross-sectional area of each pillar is greater than a cross-sectional area of each bump bond of the multiple bump bonds, where the cross-sectional area of each pillar and of each bump bond is defined along a plane parallel to the first surface of the first substrate or to the first surface of the second substrate.

12 Claims, 5 Drawing Sheets

(52) U.S. Cl.
CPC ............... *H01L 2224/81201* (2013.01); *H01L 2224/81908* (2013.01)

(56) References Cited

U.S. PATENT DOCUMENTS

| | | | |
|---|---|---|---|
| 2011/0147707 | A1 | 6/2011 | Inada et al. |
| 2012/0007232 | A1 | 1/2012 | Haba |
| 2014/0246763 | A1 | 9/2014 | Bunyk |
| 2016/0148112 | A1 | 5/2016 | Kwon |
| 2017/0047293 | A1 | 2/2017 | Moon et al. |

FOREIGN PATENT DOCUMENTS

| | | |
|---|---|---|
| JP | S61-67235 | 4/1986 |
| JP | H09252026 | 9/1997 |
| JP | H10189660 | 7/1998 |
| JP | 2005-311298 | 11/2005 |
| JP | 2006-54275 | 2/2006 |
| JP | 2007324418 | 12/2007 |
| JP | 2007335327 | 12/2007 |
| JP | 2008-186988 | 8/2008 |
| JP | 2009302189 | 12/2009 |
| JP | 2015090937 | 5/2015 |
| WO | WO 2005/122706 | 12/2005 |
| WO | WO 2013/180780 | 12/2013 |
| WO | WO 2017/105524 | 6/2017 |

OTHER PUBLICATIONS

AU Office Action in Australian Appln. No. 2017432809, dated Dec. 9, 2020, 4 pages.
AU Office Action in Australian Appln. No. 2017432809, dated Feb. 26, 2021, 4 pages.
CA Office Action in Canadian Appln. No. 3,058,725, dated Dec. 11, 2020, 3 pages.
EP Communication pursuant to Rule 114(2) EPC in European Appln. No. 17780565.2, dated Feb. 25, 2020, 7 pages.
EP Office Action in European Appln. No. 17780565.2, dated Mar. 18, 2021, 12 pages.
EP Office Action in European Appln. No. 17780565.2, dated Sep. 2, 2020, 12 pages.
Foxen et al., "Qubit compatible superconducting interconnects", Quantum Science and Technology, vol. 3, No. 1, Nov. 30, 2017.
JP Office Action in Japanese Appln. No. 2019-554728, dated Jan. 12, 2021, 20 pages (with English translation).
JP Office Action in Japanese Appln. No. 2019-554728, dated Oct. 25, 2021, 8 pages (with English translation).
Kim et al., "Silicon Hard-Stop Mesas for 3D Integration of Superconducting Qubits," APS March Meeting 2017, oral presentation on Mar. 14, 2017, and abstract (https://meetings.aps.org/Meeting/MAR17/Session/H46.2), 20 pages.
KR Office Action in Korean Appln. No. 10-2019-7027165, dated Mar. 2, 2021, 13 pages (with English translation).
O'Brien et al., "Superconducting Caps for Quantum Integrated Circuits," https://arxiv.org/abs/1708.02219, Aug. 2017, 4 pages.
Office Action in Chinese Appln. No. 201780089171.8, dated Nov. 8, 2022, 15 pages (with English translation).
Office Action in Japanese Appln. No. 2019-554728, dated Aug. 22, 2022, # pages (with English translation).
Office Action in Korean Appln. No. 10-2019-7027165, dated Aug. 13, 2021, 3 pages (with English translation).
PCT International Preliminary Report on Patentability in International Appln. No. PCT/US2017/052132, dated Apr. 2, 2020, 12 pages.
PCT International Search Report and Written Opinion in International Application No. PCT/US2017/052132, dated Jun. 14, 2018, 19 pages.
Qiang et al., "Extensible 3D architecture for superconducting quantum computing", Applied Physics Letters, vol. 110, No. 23, Jun. 8, 2017.
Search Report in European Appln. No. 22199044.3, dated Jan. 2, 2023, 9 pages.
Office Action in Japanese Appln. No. 2022-149066, dated Aug. 28, 2023, 11 pages (with English translation).

FIG. 5B and# PILLARS AS STOPS FOR PRECISE CHIP-TO-CHIP SEPARATION

CROSS-REFERENCE TO RELATED APPLICATIONS

This is application is a continuation application of U.S. application Ser. No. 16/614,108, filed on Nov. 15, 2019, which is a national stage application under 35 U.S.C. § 371 of PCT International Application No. PCT/US2017/052132, filed Sep. 19, 2017. The contents of the foregoing applications are hereby incorporated by reference.

TECHNICAL FIELD

The present disclosure relates to using pillars as stops for precise chip-to-chip separation in stacked devices.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle+\beta|1\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

In general, one innovative aspect of the subject matter described in this specification can be embodied in a device that includes a first substrate, including a quantum information processing device, and a second substrate bonded to the first substrate, and multiple bump bonds and at least one pillar between the first substrate and the second substrate. Each bump bond of the multiple bump bonds provides an electrical connection between the first substrate and the second substrate. The at least one pillar defines a separation distance between a first surface of the first substrate and a first surface of the second substrate. A cross-sectional area of each pillar is greater than a cross-sectional area of each bump bond of the multiple bump bonds, where the cross-sectional area of each pillar and of each bump bond is defined along a plane parallel to the first surface of the first substrate or to the first surface of the second substrate.

Implementations of the device can include one or more of the following features. In some implementations, the multiple bump bonds are superconducting bump bonds (e.g., indium bump bonds). The at least one pillar between the first substrate and the second substrate can be a superconducting pillar (e.g., an indium pillar).

In some implementations, a first bump bond of the multiple bump bonds provides an electrical connection between the first quantum information processing device (e.g., a qubit) and a circuit element on the second substrate. The at least one pillar may provide an electrical connection between a circuit element on the first substrate and a circuit element on the second substrate.

In some implementations, the at least one pillar is a ring such that when the first substrate and the second substrate are at the separation distance, the ring surrounds the at least one quantum information processing device (e.g., a qubit) on the first substrate.

In general, another aspect of the subject matter described in this specification can be embodied in methods that include the actions of using pillars as stops for precise chip-to-chip separation in stacked devices. A method can include providing a first substrate and a second substrate, where the first substrate includes multiple bump bonds and at least one pillar where a thickness of each pillar is less than a thickness of each bump bond of the multiple bump bonds, and where the thickness extends a long a direction that is normal to a first surface of the first substrate on which the at least one pillar is formed, and bonding the first substrate to the second substrate. The bonding of the first substrate and the second substrate includes applying a force between the first substrate and the second substrate to compress the multiple bump bonds to the same thickness as the thickness of the at least one pillar.

In some implementations, applying the force between the first substrate and the second substrate compresses the at least one pillar such that a width of the at least one pillar expands. The expansion of the at least one pillar may be measured. For example, measuring the expansion of the pillar includes using an edge-view microscope to determine the amount of expansion as viewed through a gap between the first substrate and the second substrate. In another example, measuring the expansion of the pillar includes measuring a lateral expansion of the pillar with respect to registration marks patterned on the first substrate.

In some implementations, a calibration force is obtained prior to bonding the first substrate to the second substrate. For example, obtaining the calibration force can include providing a third substrate including a plurality of bump bonds and a fourth substrate, and applying a force between the third substrate and the fourth substrate to achieve a predetermined separation distance between the third substrate and the fourth substrate, such that the force applied between the first substrate and the second substrate is at least as great as or greater than the force applied between the third substrate and the fourth substrate.

Particular embodiments of the subject matter described in this specification can be implemented so as to realize one or more of the following advantages. The techniques disclosed herein improve the repeatability, precision, and uniformity of the separation distance between the first substrate and the second substrate, which in turn may improve the repeatability, precision, and in some cases the uniformity of coupling between circuit elements (e.g., qubits) on the first substrate and corresponding circuit elements (e.g., qubit control circuit elements) on the second substrate. By implementing these pillars, this technique improves the repeatability, precision (e.g., sub-micron), and uniformity of the bump bonding between the two substrates of the stacked device (e.g., a flip-chip device). Processes for defining and depositing pillars and bump bonds can be compatible with circuit elements that are present on the one or more substrates in the stacked device design. Consistent, repeatable chip-to-chip separation using the pillars improves the 3D integration of qubits with quantum circuit elements in a stacked device design. In some implementations, pillars arranged around a perimeter of circuit elements on a substrate (e.g., a ringshaped pillar surrounding a quantum information processing device) can provide electromagnetic and electrostatic insulation for the circuit element.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIGS. TA-1B are schematics illustrating top views of examples of a first substrate and a second substrate, respectively.

FIGS. 2A-2H are schematics illustrating an exemplary process for fabricating pillars and bump bonds on a first substrate.

DETAILED DESCRIPTION

Quantum computing entails coherently processing quantum information stored in the quantum bits (qubits) of a quantum computer. Superconducting quantum computing is a promising implementation of quantum computing technology in which circuit elements are formed, in part, from superconducting materials. Superconducting quantum circuit elements, such as superconducting qubits, are operated at very low temperatures so that superconductivity can be achieved and so that thermal fluctuations do not cause undesired transitions between energy levels.

In certain types of quantum computing processors, such as quantum annealers, the superconducting qubits of the quantum processor are operatively coupled together in a controllable manner such that the quantum state of each superconducting qubit affects the corresponding quantum states of the other superconducting qubits to which it is coupled. Depending on the processor design, the chosen architecture may limit the density and total number of superconducting qubits available for coupling, and thus limit the ability of the processor to perform complex problems requiring large numbers of superconducting qubits.

To increase superconducting qubit density and expand the number of superconducting qubits available for coupling in a quantum processor, such as a quantum annealer having superconducting quantum circuit elements, the processor and associated circuit elements can be constructed using 3D integration (e.g., flip-chip configuration). That is, instead of fabricating the quantum circuit elements of the processor within a single plane of a substrate that extends along one and/or two dimensions (e.g., x- and/or y-directions), the quantum circuit elements can also be formed in multiple substrates that are coupled together along a third dimension (e.g., z-direction).

An approach for achieving 3D integration is to couple the substrates using bump bonding, in which the substrates are joined to one another by, e.g., superconducting bump bonds, to form a stacked device (e.g., a stacked quantum information processing device). In some implementations, bump bonds may be used to electrically couple together components from different substrates within the stack in addition to physical coupling of the substrates. Alternatively, bump bonds solely may be used to provide physical coupling of different substrates. By using superconducting bump bonds for coupling, it is possible to achieve a reduction in the energy loss and decoherence that can otherwise occur with lossy non-superconducting materials.

The subject matter of the present disclosure relates to techniques for increasing the uniformity of the separation distance between the first and second substrates and accuracy of bump bonding for a flip-chip configuration. Generally, the techniques cover forming pillars (e.g., superconducting pillars) on a first substrate and bonding a second substrate to the first substrate, in which the pillars act as alignment stops for a bump bonding process. The pillars may be used as compressible stops to achieve the predetermined distance and increase the uniformity of the separation distance between the substrates that are bonded together and/or 2) to obtain information about the repeatability and precision (e.g., sub-micron precision) of the bonding process through certain measurement techniques, as explained herein. Repeatability and precision in substrate separation distance and uniformity in the separation distance between bonded substrates lead to improved coupling between circuit elements (e.g., qubits) on the first substrate and corresponding circuit elements (e.g., qubit control circuit elements) on the second substrate at different locations of each respective substrate.

Figure 1A:
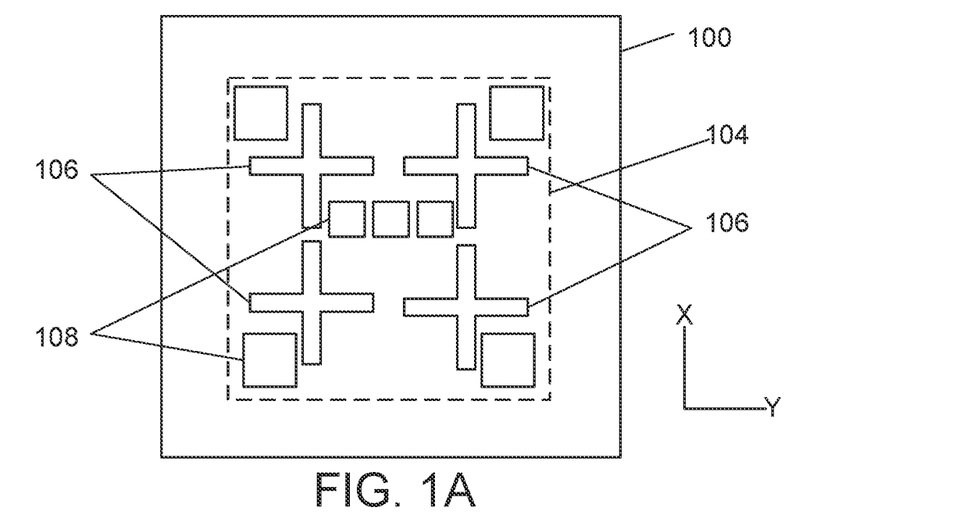
Figure 1B:
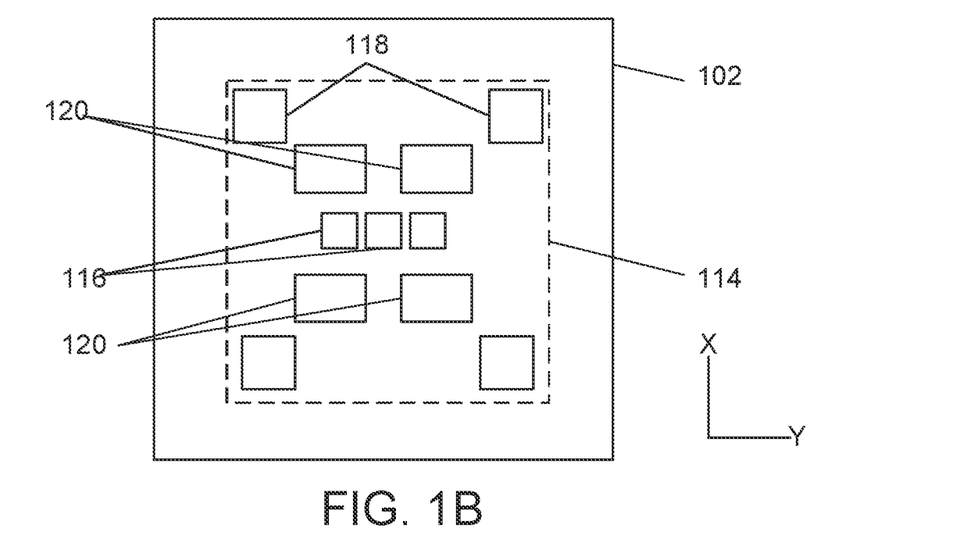

FIGS. 1A-1B are schematics illustrating top-views of examples of a first substrate 100 and a second substrate 102, respectively, in which the first substrate 100 is to be bonded to the second substrate 102. FIG. 1A is a schematic illustrating atop view of the first substrate 100 with an example of a layout 104, including one or more first circuit elements 106 formed on the first substrate 100 and one or more diffusion barriers 108. The first circuit elements 106 can include, for example, quantum information processing devices for performing quantum information processing operations. That is, the quantum information processing devices can be configured to make use of quantum-mechanical phenomena, such as superposition and entanglement, to perform operations on data in a non-deterministic manner.

Certain quantum information processing devices, such as qubits, can be configured to represent and operate on information in more than one state simultaneously. In some implementations, quantum information processing devices include circuit elements formed in part from superconducting materials such as, for example, superconducting co-planar waveguides (e.g., superconducting qubit measurement resonators and superconducting qubit couplers), quantum LC oscillators, superconducting quantum interference devices (SQUIDS) (e.g., RF-SQUID or DC-SQUID), qubit control elements, among others. The first circuit elements 106 can, depending on element type and design, be formed of one or more layers of material such as, e.g., superconducting materials (e.g., thin film aluminum) and dielectrics (e.g., aluminum oxide). To reduce energy loss and decoherence, the first substrate 100 for the first circuit elements 106 can be formed from a low loss dielectric material, such as single crystalline silicon or sapphire. Though the circuit elements 106 (e.g., superconducting qubits) are shown to have a shape of a cross in the example of FIG. 1A, the circuit elements 106 may have different shapes depending on the type of circuit element used.

FIG. 1B is a schematic illustrating a top-view of the second substrate 102, having an example layout 114. Layout 114 includes one or more second circuit elements 120 formed on or within the second substrate 102. The second circuit elements 120 also can include quantum information processing devices as described herein, such as superconducting qubits, qubit measurement resonators, qubit coupler elements, and qubit control elements. Similarly, the second substrate 102 can be formed from a low loss dielectric material suitable for quantum information processing devices, such as single crystalline silicon or sapphire.

In some implementations, second circuit elements 120 of the second substrate 102 can be used to transmit data to and/or receive data from the quantum circuit elements 106 fabricated on the first substrate 100 through electrical connections established by the superconducting bump bonds 116.

Though shown in FIGS. 1A and 1B as single components, the first circuit elements and/or the second circuit elements can be constructed using layers of different materials (e.g., semiconductors, dielectrics and metals). In some implementations, the first circuit elements and/or the second circuit elements may be fabricated using standard CMOS fabrication processes.

Example layout 114 also includes one or more bump bonds 116 and one or more pillars 118 arranged on a principal surface of the second substrate 102. In some implementations, bump bonds 116 are formed from superconducting materials, such as, e.g., indium, lead, rhenium, or palladium among others. Bump bonds 116 may be formed to have various geometric shapes prior to bonding, including, e.g., square cuboid shapes, rectangular cuboid shapes, cylinder shapes, ring shapes, and triangular prism shapes, among other shapes.

A maximum lateral dimension 115 of a bump bond 116 in the plane of a surface of the second substrate 102 may range between approximately 1 μm-100 μm prior to bonding and approximately 2 μm-150 μm after bonding. Each bump bond 116 can have a cross-sectional area (e.g., along the X-Y plane) ranging between, e.g., 1 μm$^2$ to approximately 100 μm$^2$ prior to bonding, and approximately 2 μm$^2$ to 150 μm$^2$ after bonding. For example, a bump bond 116 may have a cross-sectional area (defined, e.g., along the X-Y plane) that is 10 μm$^2$ after bonding.

Figure 1C:
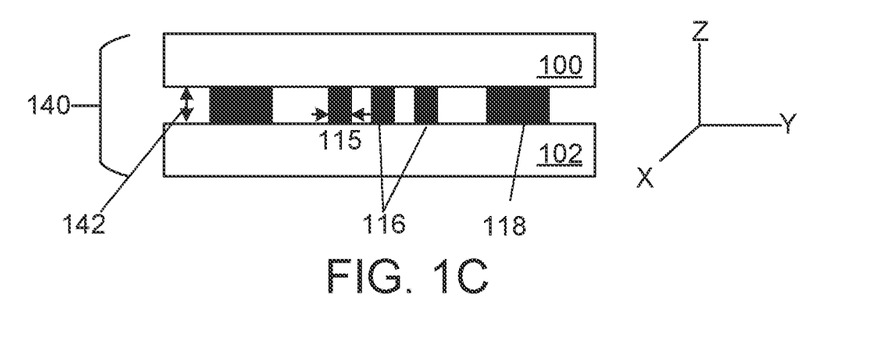
FIG. 1C is a schematic illustrating a side view of an example of a stacked device.

Each bump bond 116 has a thickness (e.g., along the Z-direction in FIG. 1C). For example, each bump bond 116 may have a thickness prior to bonding and after bonding in the range of, e.g., approximately 1 μm to approximately 50 μm. In certain implementations, to ensure that a uniform distance between the first and second substrates is maintained and to ensure proper electrical connection between circuit elements on the first substrate and circuit elements on the second substrate, each bump bond 116 is formed to have the same thickness. In some implementations, a bump bond 116 width-to-thickness ratio is 2:1. A bump bond 116 width-to-thickness ratio can also be a 1:1 ratio.

Though bump bonds 116 are shown in FIG. 1B as being formed on second substrate 102 alone, bump bonds 116 may be formed on first substrate 100, or on both first substrate 100 and second substrate 102. By providing bump bonds 116 on both the first substrate and the second substrate, it is possible, in some implementations, to ensure a reliable bond between the first substrate and the second substrate, even when there is some misalignment in the bonding process. For example, rectangular bump bonds 116 may be formed on the first substrate and second substrate, where lengths of the respective rectangular bump bonds are oriented 90 degree with respect to one another such that when the first substrate and second substrate are bonded together, the respective bump bonds overlap to form a cross. The cross-shaped bump bonds may be less sensitive to lateral shift misalignment and in-plane tilt misalignment from the bump bonding process.

Pillars 118 also are arranged on the surface of the second substrate 102 to provide resistance during a bonding step to stop compression. That is, during bonding of the first substrate 100 to the second substrate 102, the pillars 118 serve as a stop that counters the bonding force to ensure that a proper separation distance is maintained between the first substrate 100 and the second substrate 102. In some implementations, pillars 118 are formed from a malleable material that allows a slight give or yield when bonding force is applied between the first substrate 100 and the second substrate 102. For example, pillars 118 may be formed of materials with material hardness of less than approximately 10 GPa. The slight give or yield of the pillar material reduces the probability that a non-uniform gap distance will form between the first substrate 100 and the second substrate 102 when bonding. Pillars 118 also may be fabricated from superconducting materials, which would allow the pillars 188 to serve as electrical connections between a circuit element on the first substrate and a circuit element on the second substrate in addition to compression stops. Examples of materials that may be used as pillars 118 include, e.g., indium, lead, rhenium, or palladium, among other materials. In contrast, if a pillar is formed from a relatively hard material, such as silicon, silicon dioxide (SiO$_2$), or silicon nitride (SiN), there is a higher likelihood of errors in registration between the first substrate 100 and the second substrate 102 if the substrates initially come together at the wrong angle. Such errors can lead to gap formation between the substrates and bump bonds, as well as a non-uniform gap distance between the first substrate and the second substrate. Suitable non-superconducting materials for use as a non-superconducting pillar 118 include, e.g., gold.

To provide sufficient resistance to the bonding force, each pillar 118 may have a cross-sectional area (e.g., as defined along the X-Y plane) that is greater than a cross-sectional area (defined, e.g., along the X-Y plane) of a bump bond 116 prior to bonding. For example, in some implementations, pillar 118 has a cross-sectional area ranging between approximately 100 μm$^2$ to approximately 10$^6$ μm$^2$ prior to bonding. For example, a pillar 118 may have a rectangular cross-sectional area (defined, e.g., along the X-Y plane) that is 500×500 μm$^2$. When formed from a malleable material, the cross-sectional area may increase slightly due to the compression force of bonding. For example, the cross-sectional area of the pillar can expand by a range of approximately 1-10 μm$^2$. Pillars 118 may be formed to have various geometric shapes prior to bonding. For example, pillars 118 may have, e.g., square cuboid shapes, rectangular cuboid shapes, cylinder shapes, ring shapes, and triangular prism shapes, among other shapes.

Each pillar 118 may have a thickness (defined, e.g., normal to the surface of a substrate, such as along the Z-direction) in the range of approximately 1 μm to approximately 50 μm. In certain implementations, each pillar 118 has the same thickness to maintain a uniform separation of the first substrate 100 from the second substrate 102 across both chips. In some implementations, the thicknesses of pillars 118 are less than the thicknesses of the bump bonds 116 prior to bonding. When the first substrate and the second substrate are then bonded together, an applied force for bonding the two substrates will first deform the bump bonds 116 (e.g., reducing their thickness) to match the thickness of the pillar 118, where the pillar 118 acts as a "stop" for a deformed bump thickness and can set a substrate-to-substrate separation distance. For example, each pillar 118 may be formed to be 5 microns thick prior to bonding, whereas each bump bond 116 may be formed to be 6 microns thick prior to bonding.

The thickness of the superconducting bump bonds 116 and/or a thickness of pillar 118 may be set so that the first substrate 100 and second substrate 102 are spaced by a predetermined amount when configured in a stacked device. In some implementations, the thickness and cross-sectional area of each pillar 318 may be set such that a particular registration (e.g., separation distance) between the substrates is achieved when the substrates are bonded together. A calibration process may be used to determine the thickness of each pillar 318 to achieve a particular separation distance. For example, a calibration process can include applying a particular force to pillars 318 of varying thickness until the particular separation distance is achieved for a particular thickness at the particular applied force. In some implementations, the thickness of the pillars 118 may be selected to achieve a particular electromagnetic coupling between circuit elements on the first substrate 100 and circuit elements on the second substrate 102. FIG. 1C is a side-view schematic illustrating an example of a stacked device 140. Stacked device 140 includes a first substrate (e.g., first substrate 100) bonded to a second substrate (e.g., second substrate 102), in which the stacked device 140 further includes bump bonds (e.g., bump bonds 116) and pillars (e.g., pillars 118). The first substrate 100 may be separated from the second substrate 102 by a separation distance 142.

In some implementations, separation distance 142 between a surface of the first substrate 100 facing an opposing surface of the second substrate 102 can be set to be between approximately 0.5 μm to approximately 100 μm (e.g., approximately 1 μm, approximately 5 μm, approximately 10 μm, approximately 20 μm, approximately, 50 μm, or approximately 75 μm). For devices where coupling is desired between quantum information processing devices on the first substrate and quantum information processing devices on the second substrate, it may be preferable to set the separation distance 142 at the lower end of the foregoing range since a smaller separation distance may allow greater electromagnetic coupling between the devices. For example, the separation distance 142 can be within approximately 0.5 μm to approximately 1 μm. In other implementations where coupling is not desired between devices on the first substrate and devices on the second substrate, the separation distance 142 may be set at the higher end of the foregoing range, since a larger distance may reduce electromagnetic coupling between the devices. For example, the separation distance 142 can be within approximately 50 Vim to approximately 100 μm.

The distance of separation 142 can be set through one or more calibration procedures. Calibration procedures are discussed in further detail with reference to FIGS. 3 and 4 below.

In some implementations, substrates within the stack also include diffusion barriers for the bump bonds and/or for the pillars. For example, as shown in FIG. 1, substrate 100 includes diffusion barriers 108. The diffusion barriers 108 may be formed on the surface of one or more circuit elements 106 on the substrate 100. Alternatively, or in addition, the diffusion barriers 108 may be formed on interconnects or other circuit elements that electrically connect to elements 106. For example, the diffusion barriers 108 may be formed on a portion of an interconnect pad, a co-planar waveguide (e.g., on a center line of a co-planar waveguide), a ground plane, a qubit measurement resonator, a qubit coupler element, or a superconducting qubit, among other types of circuit elements. The purpose of a diffusion barrier is to prevent diffusion of material between the bump bond (and/or the pillar) and an underlying layer on which the bump bond (and/or pillar) is formed. For example, in some cases, when the bump bond and/or pillar is formed from a superconducting material, such as indium, directly on and in contact with another different superconducting material, such as aluminum, there may be diffusion between the aluminum and indium, creating a non-superconducting alloy that increases decoherence effects and/or mechanical failure of the contact. To avoid the formation of alloys between the superconducting bump bond (and/or pillar) and an underlying superconducting layer, the diffusion barrier layer may be formed from a superconducting material that blocks the diffusion of the bump bond material (and/or the pillar material) into the underlying superconducting layer. An example material that may be used for the diffusion barrier 108 includes titanium nitride (TiN). TiN may be used to prevent diffusion between a bump bond and/or pillar formed from indium and an underlying layer formed from aluminum. A thickness of the diffusion barrier layer 108 may be between approximately 1 nm to approximately 100 nm thick (e.g., 60 nm thick).

Alternatively, or in addition, diffusion barriers are formed on the second substrate 102 between the bump bonds 116 and the substrate 102. The diffusion barriers on the second substrate 102 may be formed on a portion of a circuit element 120 and/or are formed on interconnects that connect to circuit elements 120. For example, diffusion barriers on the second substrate 102 may be formed on an interconnect pad, a co-planar waveguide (e.g., on a center line of a co-planar waveguide), a ground plane, a qubit measurement resonator, a qubit coupler element, or a superconducting qubit, among other types of circuit elements. The diffusion barriers on the second substrate 102 may be formed, e.g., from TiN and have a thickness of, e.g., between 1 nm and 100 nm.

The location and number of pillars 118 formed on the second substrate 102 may vary. In some implementations, pillars 118 are formed near an outer perimeter of the second substrate 102. For example, the pillars 118 may be formed at respective corners of the substrate 102 (as depicted in FIG. 1B). Further details of pillars 118 geometry and layout on the second substrate 102 are discussed with reference to FIGS. 5A-C below.

Figure 2A:
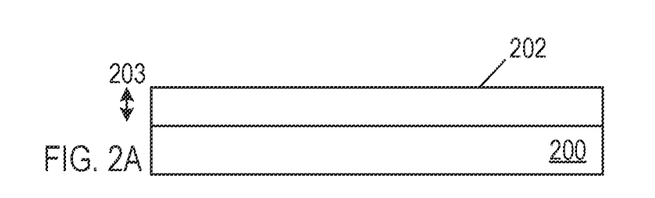

FIGS. 2A-2H are schematics illustrating an exemplary process for fabricating pillars (e.g., pillars 118) and bump bonds (e.g., bump bonds 116) on a substrate 200 (e.g., the second substrate 102). FIG. 2A illustrates a substrate 200 with a first resist layer 202 deposited on a surface of the substrate 200. First resist layer can be deposited on the surface of the substrate 200 using, for example, a spin-coating process. Example resist materials for the first resist layer 202 can include positive or negative photoresists, e.g., NR26-25000P. The first resist layer can have a thickness 203 (e.g., extending in this example normal to a surface of the substrate 200) ranging between approximately 100 nm and approximately 100 μm. In some implementations, thickness 203 of the first resist layer 202 is selected based in part on a predetermined thickness of a pillar that is formed on the surface of the substrate 200 (e.g., 3-20 μm for a pillar 118 thickness). In some implementations, the resist layer 202 is formed on an underlying circuit element that is arranged on the substrate surface. For example, the resist layer 202 may be formed over a qubit, a qubit measurement resonator, a qubit coupler element, or a qubit control element. The circuit elements on which the resist layer may be formed can include, e.g., a thin-film layer of superconducting material, such as aluminum.

The first resist layer 202 is baked to remove solvents, and then patterned using one or more exposure techniques to define one or more dimensions (e.g., a width 205) of a pillar within the first resist layer 202. An exposure process can include e-beam lithography, deep-UV (DUV) lithography, or another technique for exposing the resist layer 202.

Figure 2B:
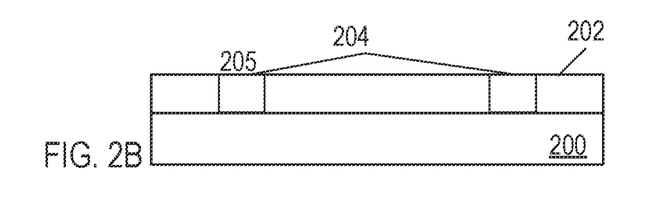

After the first resist layer 202 is exposed, the first resist layer 202 is developed in a development process to remove resist material and form openings 204 into which pillars will be formed (as illustrated in FIG. 2B). The development process, (e.g., a developer used to develop the resist layer) can depend in part on the material of the first resist layer (e.g., negative resist or positive resist). In one example, the first resist layer 202 is developed using AZ300MIF. Opening 204 can include a width 205, which can correspond to a width of a pillar (e.g., a width of 500 microns). As an alternative to exposure and development, in some implementations, the openings may be formed using a dry-etch (e.g., using a plasma etch).

Figure 2C:
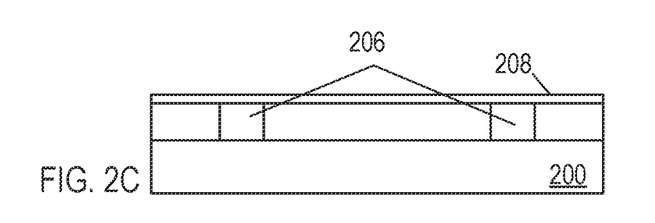

A first deposition process is performed through the openings 204 in first resist layer 202 onto substrate 200 to form pillars 206. FIG. 2C illustrates a first deposited layer including pillars 206. The first deposition process can include a first deposition of material using, for example, thermal evaporation. A first deposited material can include, for example, materials that can exhibit superconducting properties, including indium, lead, rhenium, palladium, among others. In some implementations, the first deposited material can include, for example, non-conducting materials, including silicon, silicon dioxide ($SiO_2$), and silicon nitride (SiN). In some implementations, the deposition process can include forming a first diffusion barrier layer, followed by a layer of material that forms the pillar. For example, the deposition process may include forming a titanium nitride diffusion barrier layer (e.g., between 1 nm and 100 nm) followed by deposition of a thicker superconducting material, such as indium, that forms the pillar. During the deposition process, excess material 208 can be deposited on a top surface of the first resist layer 202.

Figure 2D:
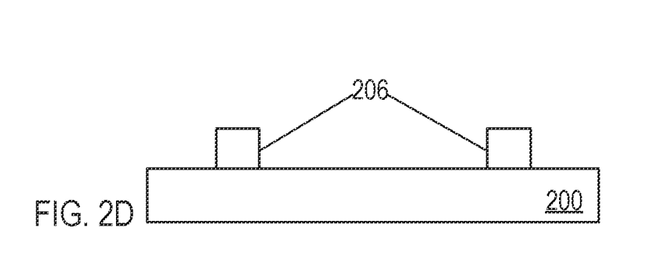

The first resist layer 202 and excess deposited material 208 are removed, for example, in a lift-off process or by an etch-back process. Example lift-off processes include immersing the substrate and deposited layers in a solvent (e.g., acetone, 1165) for a period of time. After lift-off of the first resist layer 202 and excess deposited material 208, substrate 200 remains with pillars 206 formed on the substrate 200, as illustrated in FIG. 2D.

Figure 2E:
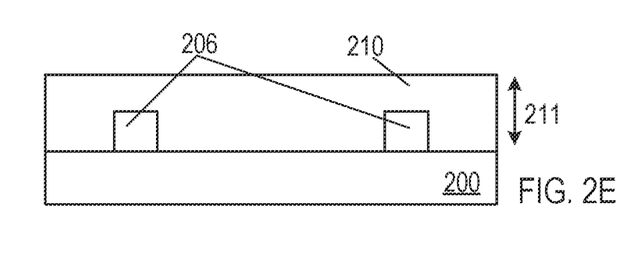

A second resist layer 210 is deposited on the surface of the substrate 200, as illustrated in FIG. 2E. The second resist layer 210 can be deposited on the surface of the substrate 200 using, for example, a spin-coating process. Example resist materials for the second resist layer 210 can include positive or negative photoresists, such as NR26-25000P. The second resist layer 210 can have a thickness 211 (e.g., extending normal to the surface of the substrate 200) ranging between approximately 100 nm and approximately 100 μm. In some implementations, thickness 211 of the second resist layer 210 is greater than the thickness 203 of the first resist layer 211, such that the subsequently formed bump bonds have a thickness greater than a thickness of pillars 206. The thickness 211 of the second resist layer 210 can be selected based in part on a predetermined thickness of a bump bond that is formed on the surface of the substrate 200, for example 3 μm.

The second resist layer 210 is baked to remove solvents, and then patterned using one or more exposure techniques to define one or more dimensions (e.g., a width 212) of an opening 214 in which a bump bond will be formed within the second resist layer 210. An exposure process can include e-beam lithography, deep-UV (DUV) lithography, or another technique for exposing the resist layer 210. In some implementations, a pattern defined in the second resist layer 210 defines one or more dimensions corresponding to a predetermined dimension of a bump bond.

Figure 2F:
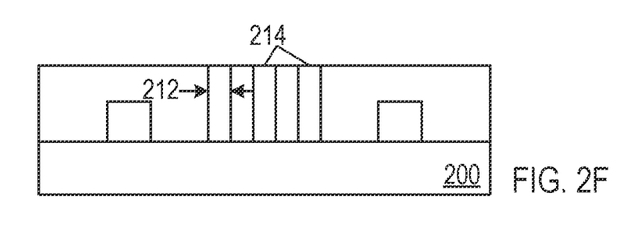

After the second resist layer 210 is patterned, the second resist layer 210 is developed in a development process to remove resist material and form the openings 214 through which bump bonds will be formed (as illustrated in FIG. 2F). The development process, including the developer used, can depend in part on the material of the second resist layer 210 (e.g., negative resist or positive resist). In one example, the second resist layer 210 is developed using AZ300MIF. Alternatively, in some implementations, the openings 214 can be formed using a dry-etch process. Opening 214 can include a width 212 which can correspond to a width of a bump bond.

Figure 2G:
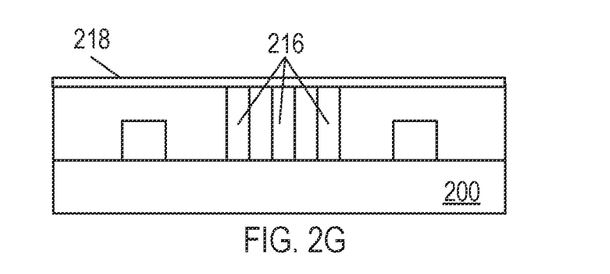

A second deposition process to form the bump bonds 216 is performed through the openings 214 in the second resist layer 210 onto substrate 200, as shown in FIG. 2G. The second deposition process can include a second deposition of material using, for example, thermal evaporation. A second deposited material can be of a same material or of a different material than the first deposited material. The second deposited material can include, for example, materials capable of exhibiting superconducting properties, such as indium, lead, rhenium, palladium, among others. In some implementations, the deposition process can include forming a diffusion barrier layer, followed by a layer of material that forms the bump bond. For example, the deposition process may include forming a titanium nitride diffusion barrier layer (e.g., between 1 nm and 100 nm) followed by deposition of a thicker superconducting material, such as indium, that forms the bump bond. The superconducting material deposited in openings 214 may be used to form an electrical connection with circuit elements (e.g., a qubit, a qubit measurement resonator, a qubit coupler element, a qubit control element) formed on the substrate 200 and under the second resist layer 210

The second resist layer 210 and excess deposited material 218 are removed in a lift-off process. Example lift-off processes include immersing the substrate and deposited layers in a solvent (e.g., acetone or 1165) for a period of time. After lift-off of the first resist layer 210 and excess deposited material 218, substrate 200 remains with bump bonds 206 and pillars 216 formed on the substrate 200, as illustrated in FIG. 2H.

In some implementations, a diffusion barrier layer is fabricated between the pillar 206 and the substrate 200, and between the bump bond 216 and the substrate 200. The diffusion barrier layer prevents the material of the bump bond 216 and the pillar 206 (e.g., indium) from corrupting a metal contact point (e.g., an interconnect) on the substrate 200 (e.g., aluminum).

The distance of separation 142 between the first substrate 104 and the second substrate 102 in the stacked device 140 can be set through one or more calibration steps that utilize one or more pillars 118 to improve the accuracy and uniformity of the separation distance between the substrates bonded to form the stacked device.

An exemplary process for bonding substrates may include the following: (1) placing a first test substrate having bump bonds, but no pillars, in contact with a second test substrate until a predetermined separation between the substrates is obtained; (2) determining the force required to achieve the predetermined separation between the test substrates; (3) bonding a first sample substrate having both the bump bonds and pillars to a second sample substrate using slightly more force than the amount determined in step (2). The amount of additional force that is applied can be determined, e.g., by measuring the lateral expansion of a pillar under compression by using, for example, a infrared or edge-view microscope, as will be discussed in more detail with reference to FIGS. 3A-3D and FIGS. 4A-4B. Pillars can be of any shape (e.g., circular or square cross-section). In some cases, a pillar can be formed as a ring around a perimeter of the substrate.

Figure 3A:
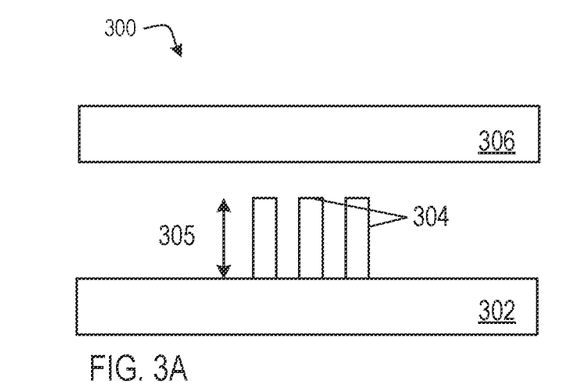
FIGS. 3A-3D are schematics illustrating an exemplary alignment calibration process.

FIGS. 3A-3D are schematics illustrating an exemplary alignment calibration process 300. A first substrate 302 including one or more bump bonds 304 is brought into proximity with a second substrate 306 such that a surface of the first substrate 302 and a surface of the second substrate 306 are parallel with respect to one another, as illustrated in FIG. 3A.

Figure 3B:
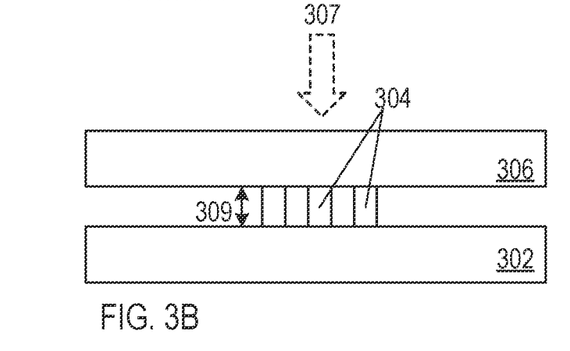

A force 307 normal to the substrates is applied between the first substrate 302 and the second substrate 306 to obtain a predetermined separation distance 309 between the first substrate 302 and the second substrate 306. The force 307 can be applied between the two substrates, applied to the first substrate 302 while the second substrate 304 is held fixed (as illustrated in FIG. 3B), or applied to the second substrate 304 while the first substrate 302 is held fixed. In some implementations, the magnitude of force 307 applied to achieve the predetermined separation distance 309 between the first substrate 302 and the second substrate 306 is determined. The magnitude of force 307 required to achieve the predetermined separation 309 depends in part on an amount of deformation of the bump bonds 304 during the bonding process.

In some implementations, an amount of separation distance 309 between the first substrate 302 and the second substrate 306 can be measured using an edge-view microscope. Measurements can be made from multiple edge views of the bonded substrates, where the multiple measurements can yield information about the uniformity of the separation distance 309 between the first substrate 302 and the second substrate 306.

Figure 3C:
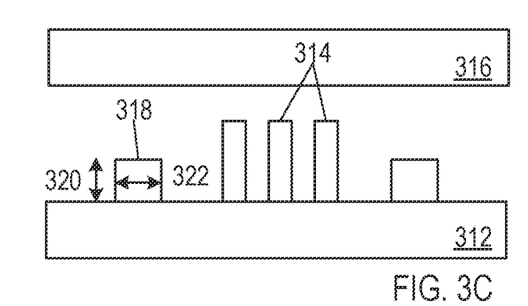

The magnitude of force 307 used to obtain the predetermined separation distance 309 between the first substrate 302 and the second substrate 306 can be used as a calibration force. The calibration force can be determined prior to bonding a first substrate and a second substrate. For example, FIG. 3C illustrates a first substrate 312 including bump bonds 314 and a second substrate 316. Additionally, the first substrate 312 includes at least one pillar 318, where pillar 318 has a thickness 320. In some implementations, the thickness 320 is equal to the predetermined separation distance 309. Pillars 318 also have a width 322 that is defined parallel to the surface of the substrate 312. The first substrate 312 is brought into proximity to the second substrate 316, such that a surface of the first substrate 312 is parallel to a surface of the second substrate 316.

Figure 3D:
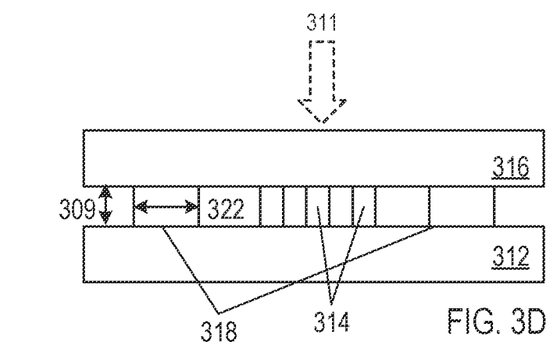

Force 311 is applied to bond the first substrate 312 and the second substrate 316, as illustrated in FIG. 3D. Pillars 318 act as stops for the bonding process, such that the pillars 318 prevent further compression of the bump bonds 314 and ensure a separation distance of 309 between the first substrate 312 and the second substrate 316. Compressing pillars 318 to achieve separation distance 309 may cause width 322 of the pillar 318 to deform (e.g., expand laterally). In some implementations, the force 311 is applied between the first substrate 312 and the second substrate 316 to compress the plurality of bump bonds 314 to the same thickness as the thickness of the one or more pillars 318. In some implementations, the force 311 applied to bond the first substrate 312 and the second substrate 316 has a magnitude greater than the magnitude of force 307, for example 5% greater than the magnitude of force 307.

Figure 4A:
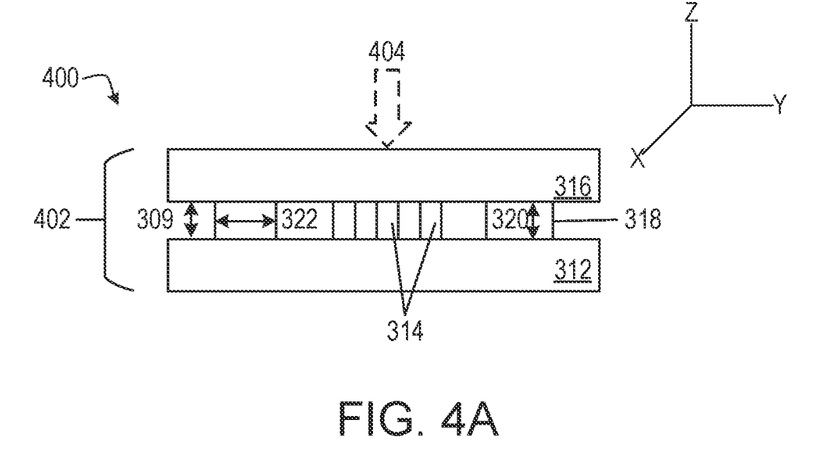
FIGS. 4A-B are schematics illustrating an exemplary alignment calibration process.
Figure 4B:
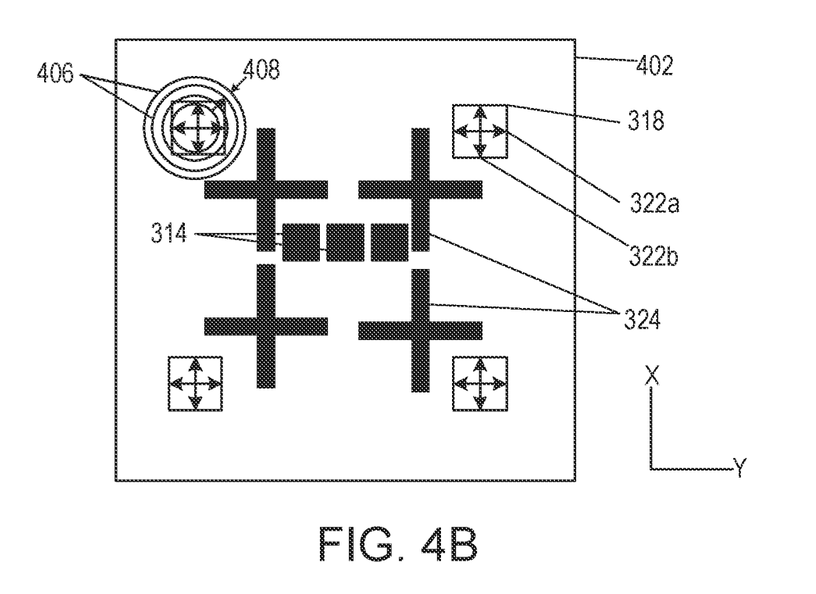

An amount of additional force applied to bond the first substrate 312 and the second substrate 316 can be determined, for example, by measuring pillar 318 deformation (e.g., width 322 deformation) during the bonding process. FIGS. 4A-B are schematics illustrating various views of another example alignment calibration process 400. FIG. 4A is a side view of the first substrate 312 bonded to the second substrate 316, whereas FIG. 4B is a top view of stacked device 402, viewed through the second substrate 316. Pillar 318 includes a first width 322a defined along an x-axis and a second width 322b defined along a y-axis, where both the first width 322a.

Force 404 is applied to bond the first substrate 312 and the second substrate 316, and measurements of width 322a and width 322b can be taken. In some implementations, a magnitude of force 404 is applied to make contact between the first substrate 312 and the second substrate 316. In one example, force 404 is applied to bond the first substrate 312 and the second substrate in steps of progressively increasing magnitude, for example, in steps of 1% increases of force, steps of 2% increases of force, steps of 5% increases of force, or the like. Measurements of the width 322a and width 322b are taken at each step, and a relationship may be determined between a difference in pre-compression width 322a and post-compression width 322a of pillar 318 and the force 404 applied between the substrates.

In some implementations, the magnitude of force 404 can be selected to be 1%-10% additional force with respect to magnitude of force 307, determined in the calibration process described with reference to FIG. 3. In one example, force 404 is applied to bond the first substrate 312 and the second substrate 316 in steps of progressively increasing magnitude (e.g., 1% greater than magnitude of force 307, 2% greater than magnitude of force 307, 5% greater than magnitude of force 307).

Measurements of width 322a and width 322b can be taken, for example, through a z-axis of the stacked device 402 and where the top substrate is transparent in the infrared (e.g., silicon), by using an infrared microscope or an industry standard optical microscope equipped with an infrared camera.

In some implementations, registration marks 406 (e.g., concentric rings) can be patterned (e.g., patterned aluminum using photolithography) on a ground plane of the second substrate 316 (e.g., the substrate including a quantum information processing device), where the registration marks are spaced by registration widths 408 (e.g., 1-10 µm spacing between registration marks). When the first substrate and the second substrate are bonded together, the lateral expansion of the pillar under compression can be determined using the registration marks 406, by measuring the lateral expansion of the pillar with respect to the registration marks 406. For example, expansion of the pillar may be related to a number of concentric rings of known spacing that the compressed pillar expands to reach, as observed through a polished surface of the first substrate (e.g., silicon wafer) of the stacked device using an infrared microscope.

In some implementations, registration marks 406 can be patterned on the ground plane of the second substrate 316 in two or more locations of the top substrate (e.g., at the corners of the top substrate). When the first substrate and the second substrate are bonded together, the lateral expansion of pillars at each corner can be measured using respective registration marks 406, such that the measurements of the pillars may yield information about the uniformity of the separation distance 309 between the first substrate 312 and the second substrate 316.

In some implementations, force 404 is selected such that the pillar 318 deforms by a threshold amount (e.g., width 322a and width 322b increase by a threshold width deformation) when force 404 is applied to bond the stacked device 402. A threshold deformation (e.g., threshold width deformation) can range from 0-50 μm.

In some implementations, the separation distance 309 between the first substrate and the second substrate is measured at each pillar 318 during a calibration process, for example, to determine a uniformity of the separation distance 309 across the stacked device 402. The separation distance 309 can be determined by measuring the deformation of each pillar 318 around a perimeter of the first substrate 312. In some implementations, each pillar 318 includes a first width 322a and a second width 322b. The separation distance between the first substrate and the second substrate may be understood to be uniform across the stacked device 402 when an amount of deformation of the first width 322a and an amount of deformation of the second width 322b is the same for each pillar (e.g., pillars 318a, 318b, 318c, and 318d).

In some implementations, a process for determining an amount of force required to achieve a particular separation distance 309 includes measuring a thickness 320 of pillar 318 (as depicted in FIG. 4A) when force 404 is applied to the stacked device during the bonding process. The thickness 320 of the pillar 318 prior to compression and after compression can be measured, for example, using an edge-view microscope (e.g., along the x-axis or y-axis) of the stacked device 402.

In some implementations, the process for determining the amount of force required to achieve a particular separation distance 309 includes measuring thicknesses 320 of multiple pillars 318 prior to compression and after compression, for example, pillars around a perimeter of the stacked device 402, where an equal deformation (e.g., equal thickness 320) of each pillar 320 in the stacked device 402 during the bonding process can indicate that the separation distance is uniform across the stacked device.

In some implementations, a process for determining the amount of force required to achieve the particular separation distance 309 includes measuring the width 322 of pillar 318 (as depicted in FIG. 4A) when force 404 is applied to the stacked device during the bonding process. The width 322 of the pillar 318 prior to compression and after compression can be measured, for example, using an edge-view microscope (e.g., along the x-axis or y-axis) of the stacked device 402.

In some implementations, a process for determining the amount of force required to achieve the particular separation distance 309 includes measuring thickness 320 of multiple pillars 318 prior to compression (e.g., using edge-view microscopy) and measuring the lateral expansion of the multiple pillars 318 after compression (e.g., using the infrared microscope and registration marks 406), by accounting for conservation of total volume of the pillars prior to compression and after compression.

In some implementations, calibration process 400 includes in situ measurements while force 404 is actively applied to the stacked device 402 during the bonding process. In some implementations, calibration process 400 includes ex situ measurements where one or more measurements (e.g., measurements of width 322a, width 322b, and/or thickness 320) after the bonding process and when force 404 is not being applied to the stacked device. A combination of both in situ and ex situ measurements can also be made. Pillars 318 are illustrated in FIG. 4A-B as having rectangular cross-sections and located at four corners of the first substrate 312. Other geometries for pillars 318 and configurations for pillars 318 on the first substrate 312 are conceivable.

Figure 5A:
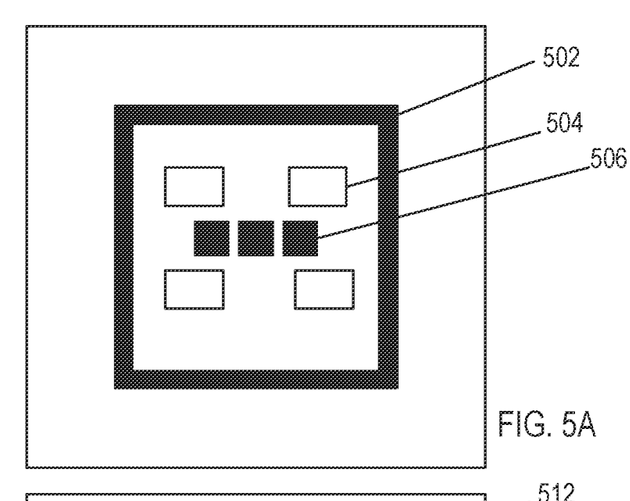
FIGS. 5A-5C are top-view schematics illustrating example layouts for a first substrate.

FIGS. 5A-5C are top-view schematics illustrating example layouts for a first substrate. In one example, as illustrated in FIG. 5A, pillar 502 is a ring shape surrounding the one or more circuit elements 504 (e.g., a quantum information processing device) and one or more bump bonds 506. The ring shape pillar 502 can be formed on a first substrate (e.g., substrate 100) such that when the first substrate and a second substrate (e.g., substrate 102) are bonded together (e.g., stacked device 140) at a separation distance (e.g., separation distance 142), the ring shape pillar 502 surrounds at least one quantum information processing device (e.g., a qubit). In some implementations, the ring shape pillar 502 can function as a Faraday cage where the ring shape pillar 502 surrounds circuit elements 504 and is electrically connected to a ground plane, such that the ring shape pillar 502 can exclude electromagnetic and electrostatic fields from interacting with the circuit elements 504.

Figure 5B:
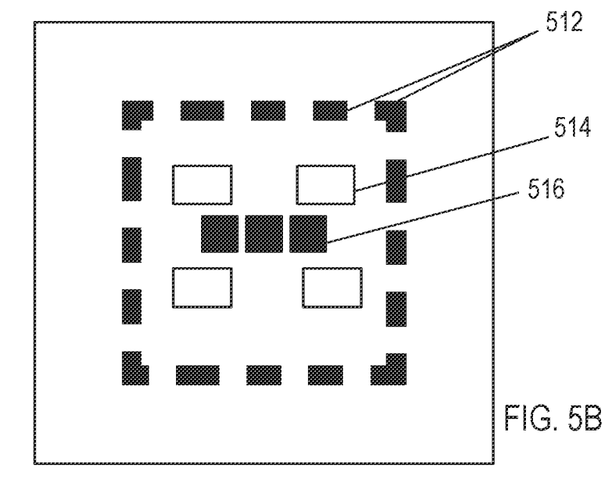

In another example, as illustrated in FIG. 5B, pillars 512 are arranged to form a non-continuous ring shape surrounding the one or more circuit elements 514 and one or more bump bonds 516.

Figure 5C:
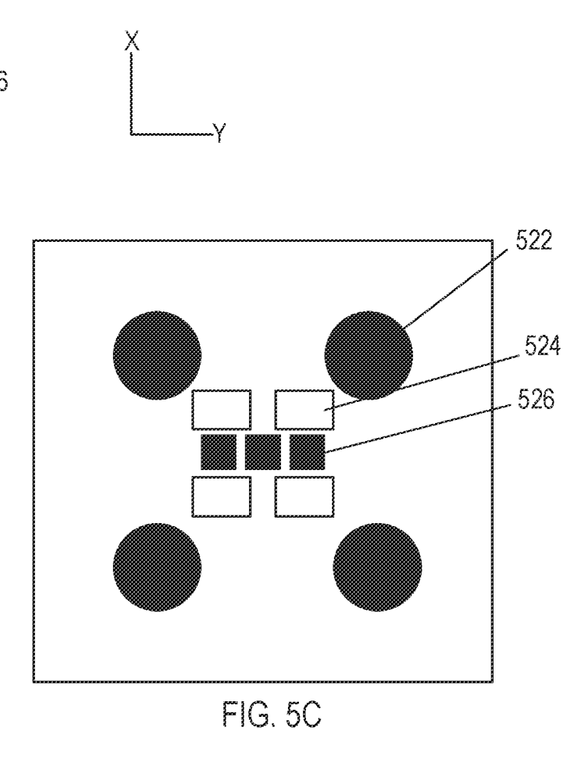

In another example, as illustrated in FIG. 5C, pillar 522 has a circular cross-section and are located at corners of a perimeter around the one or more circuit elements 524 and one or more bump bonds 526.

Though the examples presented herein pertain to a stacked device containing only two substrates joined to one another, the principles and techniques can be expanded to stacked devices containing three or more substrates. For example, a stacked device can include two substrates having quantum information processing devices, in which each substrate is joined to the other using superconducting bump bonds and pillars as described herein, and in which one of the two substrates is also joined through, e.g., superconductor bump bonds and pillars as described herein, to a third substrate that includes either quantum information processing devices or classical circuit elements.

In some implementations, some or all of the processes and characterization techniques mentioned above take place in a controlled environment which may include a high-purity vacuum chamber, temperatures below the superconducting temperature of the superconducting material, or a combination thereof.

An example of a superconducting material that can be used in the formation of quantum circuit elements is aluminum. Aluminum may be used in combination with a dielectric to establish Josephson junctions, which are a common component of quantum circuit elements. Examples of quantum circuit elements that may be formed with aluminum include circuit elements such as superconducting co-planar waveguides, quantum LC oscillators, qubits (e.g., flux qubits or charge qubits), superconducting quantum interference devices (SQUIDs) (e.g., RF-SQUID or DC-SQUID), inductors, capacitors, transmission lines, ground planes, among others.

Aluminum may also be used in the formation of superconducting classical circuit elements that are interoperable with superconducting quantum circuit elements as well as other classical circuit elements based on complementary metal oxide semiconductor (CMOS) circuitry. Examples of classical circuit elements that may be formed with aluminum include rapid single flux quantum (RSFQ) devices, reciprocal quantum logic (RQL) devices and ERSFQ devices, which are an energy-efficient version of RSFQ that does not use bias resistors. Other classical circuit elements may be formed with aluminum as well. The classical circuit elements may be configured to collectively carry out instructions of a computer program by performing basic arithmetical, logical, and/or input/output operations on data, in which the data is represented in analog or digital form.

Processes described herein may entail the deposition of one or more materials, such as superconductors, dielectrics and/or metals. Depending on the selected material, these materials may be deposited using deposition processes such as chemical vapor deposition, physical vapor deposition (e.g., evaporation or sputtering), or epitaxial techniques, among other deposition processes. Processes described herein may also entail the removal of one or more materials from a device during fabrication. Depending on the material to be removed, the removal process may include, e.g., wet etching techniques, dry etching techniques, or lift-off processes.

Implementations of the quantum subject matter and quantum operations described in this specification may be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations, the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements may be used to perform quantum processing operations. That is, the quantum circuit elements may be configured to make use of quantum-mechanical phenomena, such as superposition and entanglement, to perform operations on data in a non-deterministic manner. Certain quantum circuit elements, such as qubits, may be configured to represent and operate on information in more than one state simultaneously. Examples of superconducting quantum circuit elements that may be formed with the processes disclosed herein include circuit elements such as co-planar waveguides, quantum LC oscillators, qubits (e.g., flux qubits or charge qubits), superconducting quantum interference devices (SQUIDs) (e.g., RF-SQUID or DC-SQUID), inductors, capacitors, transmission lines, ground planes, among others.

In contrast, classical circuit elements generally process data in a deterministic manner. Classical circuit elements may be configured to collectively carry out instructions of a computer program by performing basic arithmetical, logical, and/or input/output operations on data, in which the data is represented in analog or digital form. In some implementations, classical circuit elements may be used to transmit data to and/or receive data from the quantum circuit elements through electrical or electromagnetic connections. Examples of classical circuit elements that may be formed with the processes disclosed herein include rapid single flux quantum (RSFQ) devices, reciprocal quantum logic (RQL) devices and ERSFQ devices, which are an energy-efficient version of RSFQ that does not use bias resistors. Other classical circuit elements may be formed with the processes disclosed herein as well.

During operation of a quantum computational system that uses superconducting quantum circuit elements and/or superconducting classical circuit elements, such as the circuit elements described herein, the superconducting circuit elements are cooled down within a cryostat to temperatures that allow a superconducting material to exhibit superconducting properties. A superconductor (alternatively superconducting) material can be understood as material that exhibits superconducting properties at or below a superconducting critical temperature. Examples of superconducting material include aluminum (superconductive critical temperature of approximately 1.2 kelvin), indium (superconducting critical temperature of approximately 3.4 kelvin), NbTi (superconducting critical temperature of approximately 10 kelvin) and niobium (superconducting critical temperature of approximately 9.3 kelvin). Accordingly, superconducting structures, such as superconducting traces and superconducting ground planes, are formed from material that exhibits superconducting properties at or below a superconducting critical temperature.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

A number of implementations have been described. Nevertheless, it will be understood that various modifications may be made without departing from the spirit and scope of the invention. Other implementations are within the scope of the following claims.

The invention claimed is:

1. A method comprising:
providing a first substrate;
providing a second substrate;
providing a plurality of bump bonds on the first or second substrate;
providing at least one malleable compression stop on the first or second substrate, wherein the at least one malleable compression stop is configured to compress under pressure to a predefined thickness that corresponds to a separation distance between the first substrate and the second substrate, wherein the separation distance is selected based on a particular amount of electromagnetic coupling between a first component on the first substrate and a second component on the second substrate,
wherein the at least one malleable compression stop comprises a metal;
bonding the first substrate to the second substrate, wherein the bonding comprises applying a compressive force between the first substrate and the second substrate to deform the at least one malleable compression stop to the predefined thickness, wherein the at least one malleable compression stop at the predefined thickness provides sufficient resistance to inhibit further compression of the at least one malleable compression stop.

2. The method of claim 1, further comprising:
obtaining a calibration force prior to bonding the first substrate to the second substrate; and
applying the calibration force as the compressive force during bonding of the first substrate to the second substrate.

3. The method of claim 2, wherein obtaining the calibration force comprises:
providing a third substrate including a pillar;
providing a fourth substrate;
applying a variable compression force between the third substrate and the fourth substrate until a predetermined separation distance between the third substrate and the fourth substrate is achieved; and
selecting a value of the variable compression force at which the predetermined separation distance is achieved as the calibration force.

4. The method of claim 3, wherein the pillar is of the same material as the at least one malleable compression stop.

5. The method of claim 2, wherein obtaining the calibration force comprises:
providing a plurality of third substrates, each including a pillar of a different initial thickness;
providing a corresponding fourth substrate for each third substrate to provide a plurality of pairs of third substrate and fourth substrate;
applying a variable compression force between each pair of third substrate and fourth substrate until a predetermined separation distance between the third substrate and the fourth substrate is achieved; and
for each different pillar initial thickness, selecting a value of the variable compression force at which the predetermined separation distance is achieved as the calibration force for that pillar initial thickness.

6. The method of claim 5, wherein each pillar is of the same material as the at least one malleable compression stop.

7. A method comprising:
providing a first substrate;
providing a second substrate;
providing a plurality of bump bonds on the first or second substrate;
providing at least one malleable compression stop on the first or second substrate, wherein the at least one malleable compression stop is configured to compress under pressure to a predefined thickness that corresponds to a predefined separation distance between the first substrate and the second substrate,
wherein the at least one malleable compression stop comprises a metal;
bonding the first substrate to the second substrate, wherein the bonding comprises applying a compressive force between the first substrate and the second substrate to deform the at least one malleable compression stop to the predefined thickness, wherein the at least one malleable compression stop at the predefined thickness provides sufficient resistance to inhibit further compression of the at least one malleable compression stop.

8. The method of claim 7, further comprising:
obtaining a calibration force prior to bonding the first substrate to the second substrate; and
applying the calibration force as the compressive force during bonding of the first substrate to the second substrate.

9. The method of claim 8, wherein obtaining the calibration force comprises:
providing a third substrate including a pillar;
providing a fourth substrate;
applying a variable compression force between the third substrate and the fourth substrate until a predetermined separation distance between the third substrate and the fourth substrate is achieved; and
selecting a value of the variable compression force at which the predetermined separation distance is achieved as the calibration force.

10. The method of claim 9, wherein the pillar is of the same material as the at least one malleable compression stop.

11. The method of claim 8, wherein obtaining the calibration force comprises:
providing a plurality of third substrates, each including a pillar of a different initial thickness;
providing a corresponding fourth substrate for each third substrate to provide a plurality of pairs of third substrate and fourth substrate;
applying a variable compression force between each pair of third substrate and fourth substrate until a predetermined separation distance between the third substrate and the fourth substrate is achieved; and
for each different pillar initial thickness, selecting a value of the variable compression force at which the predetermined separation distance is achieved as the calibration force for that pillar initial thickness.

12. The method of claim 11, wherein each pillar is of the same material as the at least one malleable compression stop.

* * * * *